US011237231B2

(12) United States Patent
Mohan et al.

(10) Patent No.: US 11,237,231 B2
(45) Date of Patent: Feb. 1, 2022

(54) Z-AXIS MAGNETIC SENSOR WITH DISTRIBUTED FLUX GUIDES

(71) Applicants: Robert Bosch GmbH, Stuttgart (DE); Anuraag Mohan, Fremont, CA (US); Phillip Mather, Phoenix, AZ (US); Guido De Sandre, Brugherio (IT)

(72) Inventors: Anuraag Mohan, Fremont, CA (US); Phillip Mather, Phoenix, AZ (US); Guido De Sandre, Brugherio (IT)

(73) Assignee: Robert Bosch GmbH, Stuttgart (DE)

( * ) Notice: Subject to any disclaimer, the term of this patent is extended or adjusted under 35 U.S.C. 154(b) by 35 days.

(21) Appl. No.: 16/957,719

(22) PCT Filed: Dec. 20, 2018

(86) PCT No.: PCT/US2018/066938
§ 371 (c)(1),
(2) Date: Jun. 24, 2020

(87) PCT Pub. No.: WO2019/133448
PCT Pub. Date: Jul. 4, 2019

(65) Prior Publication Data
US 2020/0371171 A1 Nov. 26, 2020

Related U.S. Application Data

(60) Provisional application No. 62/610,366, filed on Dec. 26, 2017.

(51) Int. Cl.
*G01R 33/09* (2006.01)
(52) U.S. Cl.
CPC ......... *G01R 33/098* (2013.01); *G01R 33/091* (2013.01)

(58) Field of Classification Search
CPC ..... G01R 33/098; G01R 33/091; G01R 33/09
See application file for complete search history.

(56) References Cited

U.S. PATENT DOCUMENTS

| 9,588,211 B2 | 3/2017 | Liu et al. |
| 2015/0192655 A1 | 7/2015 | Liu et al. |

(Continued)

FOREIGN PATENT DOCUMENTS

| EP | 3 255 446 A1 | 12/2017 |
| JP | 2017-511489 A | 4/2017 |
| WO | 2013/119638 A1 | 8/2013 |

OTHER PUBLICATIONS

International Search Report corresponding to PCT Application No. PCT/US2018/066938, dated Apr. 23, 2019 (3 pages).

*Primary Examiner* — Alvaro E Fortich
(74) *Attorney, Agent, or Firm* — Maginot, Moore & Beck LLP (57) ABSTRACT

An out-of-plane tunneling magnetoresistive (TMR) magnetic field sensor includes a sense element that defines a sense plane and a flux guide configured to direct a magnetic field perpendicular to the sense plane into the sense plane. The magnetic field sensor further includes a first coil arranged in a first plane, a second coil electrically insulated from the first coil and arranged in a spaced-apart second plane, and drive circuitry operatively connected to the first coil and the second coil. The drive circuitry in a first mode energizes the first and second coils to generate respective first and second fields that combine to set a magnetization of the flux guide. The drive circuitry in a second mode energizes only the first coil to generate the first field so as to set a magnetization of the sense element without changing the magnetization of the flux guide.

20 Claims, 7 Drawing Sheets

(56) References Cited

U.S. PATENT DOCUMENTS

| | | | |
|---|---|---|---|
| 2015/0346290 A1 | 12/2015 | Holm et al. | |
| 2015/0380157 A1* | 12/2015 | Green | H01F 27/2823 307/104 |
| 2016/0320462 A1* | 11/2016 | Mather | G01R 33/0206 |
| 2016/0327617 A1* | 11/2016 | Deak | G01R 33/096 |
| 2016/0334472 A1* | 11/2016 | Holm | G01R 33/0035 |

\* cited by examiner

Z-AXIS MAGNETIC SENSOR WITH DISTRIBUTED FLUX GUIDES

This application is a 35 U.S.C. § 371 National Stage Application of PCT/US2018/066938, filed on Dec. 20, 2018, which claims the benefit of U.S. Provisional Application 62/610,366, filed on Dec. 26, 2017, the disclosures of which is are incorporated herein by reference in their entirety.

FIELD

The disclosure relates to magnetic field sensors and more particularly to a tunnel magnetoresistance (TMR) magnetic field sensor with z-axis sensitivity and coil arrangements that enable reset operations with reduced electrical demand.

BACKGROUND

Magnetoresistive (MR) magnetic field sensors are based on Anisotropic Magnetoresistance (AMR), Giant Magnetoresistance (GMR), or Tunneling Magnetoresistance (TMR) (also known as magnetic tunnel junction MTJ). In all three cases, the sensor is naturally suited to measure an in-plane magnetic field. MR sensors are commonly combined into a single device with high sensitivity and three orthogonal axes for use as geomagnetic magnetometers in smart devices, such as smart phones. In order to accurately determine the directions of the earth's magnetic field relative to the device, the sensor must have an identical response in all orientations of the phone.

In order to detect an out-of-plane, or Z-axis, field, flux guides may be used to guide the Z-axis field into the X-Y plane to be sensed by an in-plane sensor with Z sense elements. These flux guides have a preferred magnetization orientation for optimal Z-axis response. The flux guides can be placed below, above, or both above and below the Z sense elements. The flux guides can be a nickel-iron (NiFe) lining or other ferromagnetic lining of a trench side wall, sputter deposited, electroplated, electroless plated, or any other suitable method to deposit, structure, or place the flux guides in proximity to the sense elements. Additionally, the flux guides can be a bar or other geometries placed upon surfaces of or within the sensor structure. Exposure to a very large external field can re-orient the flux guide magnetization and introduce domain walls in the flux-guide, which can lead to a lower signal-to-noise ratio (SNR) and a shift in the offset reading from the sensor. This condition of the flux guide can be reset by applying a series of electric pulses through specially placed coils to generate a large enough magnetic field to reorient the magnetization of the flux guide into a known, previously-calibrated state.

A typical flux guide reset operation requires a large field to be passed across the length of all flux guides within the sensor bridge, which in turn requires a large voltage overhead that leads to significant power consumption for the device This attribute makes the highly accurate Z-sensor with high output stability afforded by the flux guide reset operation unsuitable for applications such as cell phones or wearable devices that have significant restrictions on the voltage and power available to be used by the sensor. In a typical case, the flux guide reset operation requires 20 V to create a pulse of 500 mA for several microseconds. This voltage and power requirement exceeds the capability of the typical smart device. One example of a typical flux guide reset operations is described in U.S. Pat. No. 9,588,211, issued on Mar. 7, 2017 to Everspin Technologies, Inc., the contents of which are herein incorporated by reference.

There is a need to significantly reduce the power requirements for a flux guide reset operation so that such operation becomes feasible for use in the smart phone and smart device markets.

SUMMARY

A magnetic field sensor in one embodiment includes a sense element arranged on a substrate of the sensor and defining a sense plane, a flux guide arranged on the substrate and configured to direct a magnetic field perpendicular to the sense plane into the sense plane, a first coil arranged substantially in a first plane, a second coil arranged substantially in a second plane that is spaced apart from the first plane, the second coil electrically insulated from the first coil, and drive circuitry operatively connected to each of the first coil and the second coil, the drive circuitry configured, in a first reset mode, to energize both the first coil and the second coil to generate a first field about the first coil and a second field about the second coil, respectively, that combine to set a predetermined magnetization direction of the flux guide, and, in a second reset mode, to energize only the first coil to generate the first field so as to set a predetermined magnetization direction of the sense element without changing the predetermined magnetization direction of the flux guide.

A method of operating a magnetic field sensor in one embodiment includes sensing, by a magnetic field sensor including a sense element, a magnetic field component perpendicular to a sense plane defined by the sense element, the magnetic field sensor further including a flux guide configured to direct the magnetic field component into the sense plane, a first coil arranged substantially in a first plane, and a second coil electrically insulated from the first coil and arranged substantially in a second plane that is spaced apart from the first plane, executing a first reset operation by selectively energizing both the first coil and the second coil to generate a first field about the first coil and a second field about the second coil, respectively, that combine to set a predetermined magnetization direction of the flux guide, and executing a second reset operation by selectively energizing only the first coil to generate the first field so as to set a predetermined magnetization direction of the sense element without changing the predetermined magnetization direction of the flux guide.

DETAILED DESCRIPTION

For the purpose of promoting an understanding of the principles of the disclosure, reference will now be made to the embodiments illustrated in the drawings and described in the following written specification. It is understood that no limitation to the scope of the disclosure is thereby intended. It is further understood that the disclosure includes any alterations and modifications to the illustrated embodiments and includes further applications of the principles of the disclosure as would normally occur to one skilled in the art to which this disclosure pertains.

MR sensors are used in a full Wheatstone bridge configuration, where all four legs of the bridge have the same resistance and react to an external field. In the presence of an external field along the sensitive direction, the resistance of two bridge legs increases, while the resistance of the other two bridge legs decreases to create a differential output voltage proportional to the applied field. Normally, this is achieved in a Z-axis sensor by positioning the flux guides asymmetrically around the TMR sense elements to result in a net differential output voltage in the presence of ambient Z-axis field.

Figure 1:
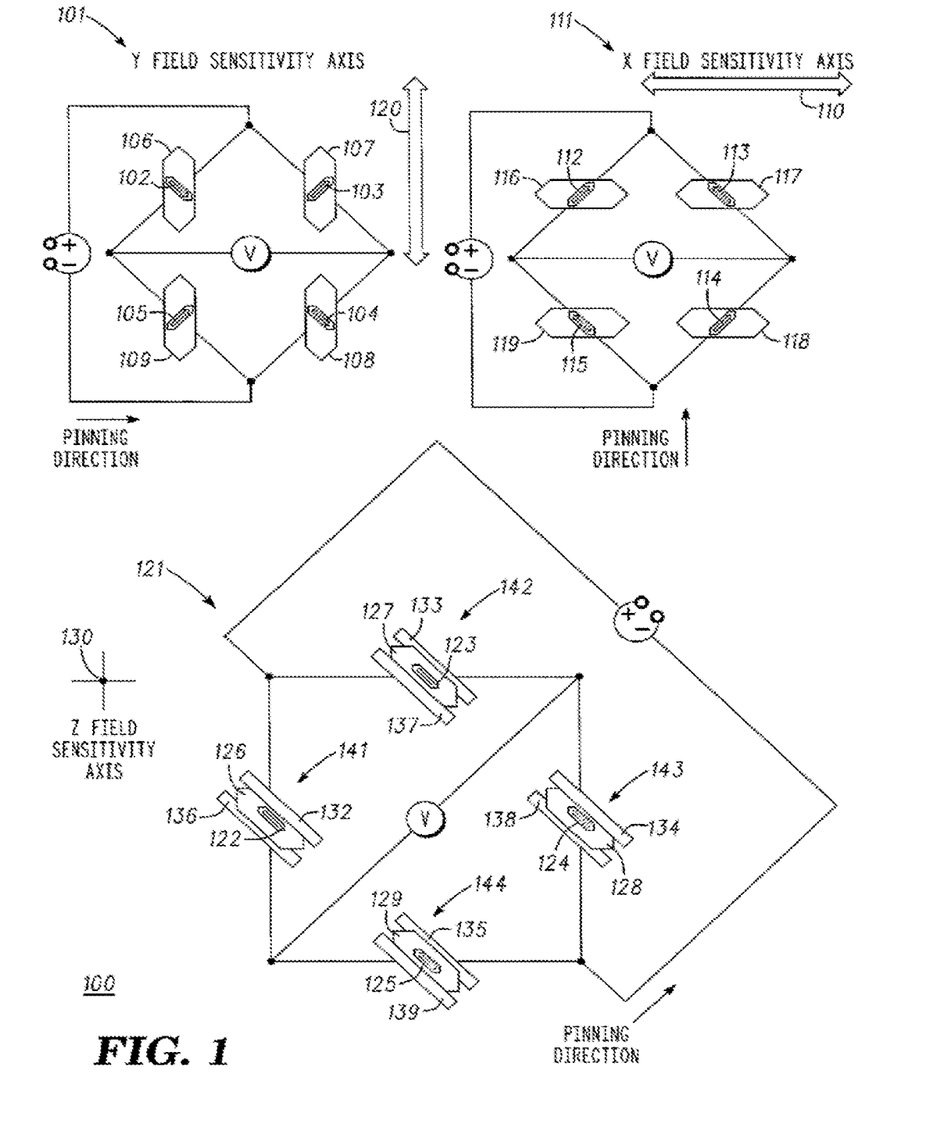
FIG. 1 schematically shows a typical MR magnetic field sensor that includes three differential sensors each formed with unshielded sense elements that are connected in a Wheatstone bridge configuration.

One example of a typical MR sensor 100 is shown schematically in FIG. 1. The MR sensor 100 includes first, second, and third differential sensors 101, 111, 121 for detecting the component directions of an applied field along a first axis 120 (e.g., the y-axis direction), a second axis 110 (e.g., the x-axis direction), and a third axis 130 (e.g., the z-axis direction), respectively. Each sensor 101, 111, 121 is formed with unshielded sense elements that are connected in a Wheatstone bridge configuration. Thus, the first sensor 101 is formed from the connection of a plurality of sense elements 102-105 in a bridge configuration over a corresponding plurality of pinned layers 106-109, where each of the pinned layers 106-109 is magnetized in the x-axis direction. In similar fashion, the second sensor 111 is formed from the connection of a plurality of sense elements 112-115 in a bridge configuration over a corresponding plurality of pinned layers 116-119 that are each magnetized in the y-axis direction that is perpendicular to the magnetization direction of the pinned layers 106-109.

Likewise, the third sensor 121 is in the same plane as the first and second sensors 101, 111 and is formed from the connection of a plurality of sense elements 122-125 in a bridge configuration over a corresponding plurality of pinned layers 126-129 that are each magnetized along the xy-axis direction to the magnetization direction of the pinned layers 106-109 and 116-119. In the third bridge configuration 121, the sense elements 122 123, 124, and 125 all have an easy axis magnetization direction that is orthogonal to the pinned magnetization direction of the pinned layers 126, 127, 128, and 129. The third bridge configuration 121 further includes flux guides 132-135 positioned adjacent to the right edge of sense elements 122-125, and flux guides 136-139 positioned adjacent to the left edge of sense elements 122-125, respectively. Flux guides 132, 137, 134, and 139 are positioned above sense elements 122-125, and flux guides 136, 133, 138, and 135 are positioned below sense elements 122-125.

By positioning the first and second sensors 101, 111 to be orthogonally aligned, each with the sense element orientations deflected equally from the sensor's pinning direction and orthogonal to one another in each sensor, the sensors can detect the component directions of an applied field along the first (y) and second (x) axes. Flux guides 132, 133, 136, 137 are positioned in sensor 121 above and below the opposite edges of the elements 122-123, in an asymmetrical manner between legs 141 and 142. The flux guides 133 and 137 placed above sense element 123 guides the magnetic flux from the Z-field into the xy plane along the right side and causes the magnetization of sense element 123 to rotate in a first direction towards a higher resistance. Similarly, the magnetic flux from the Z-field may be guided by the flux guides 132 and 136 into the xy plane along the left side of the sense element and cause the magnetization of sense element 122 to rotate in a second direction, opposite from the first direction towards a lower resistance as these guides are antisymmetric to guides 137, 133. Thus, the sensor 121 can detect the component directions of an applied field along the third (z) axis.

Figure 2:
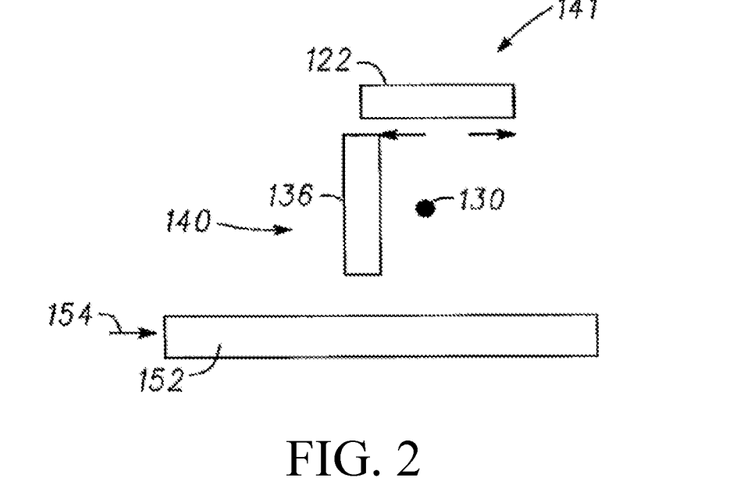
FIG. 2 is a partial cross section of a Z-axis differential sensor of the magnetic field sensor of FIG. 1 showing a flux guide and a flux guide reset coil arranged near a sense element of the Z-sensor.

FIG. 2 is a partial cross section of the TMR devices 141 of the third bridge circuit 121 including the sense element 122, and the flux guide 136, all formed within a dielectric material 140. The flux guide 136 has an end positioned below an edge of the sensor element 122. A metal stabilization/reset line 152 is positioned on one side of the TMR device 141, and orthogonal to the flux guide 136, for providing a large current pulse 154 in a direction 154, for example, that creates a reset field 130 acting upon both the sense elements and the flux guide 136. The reset field 130 is represented by a dot indicating its direction as coming from the page. The same line 152 can also be used as a stabilization line. A current flowing through 152 creates a stabilization field at the sense elements 122.

Figure 3:
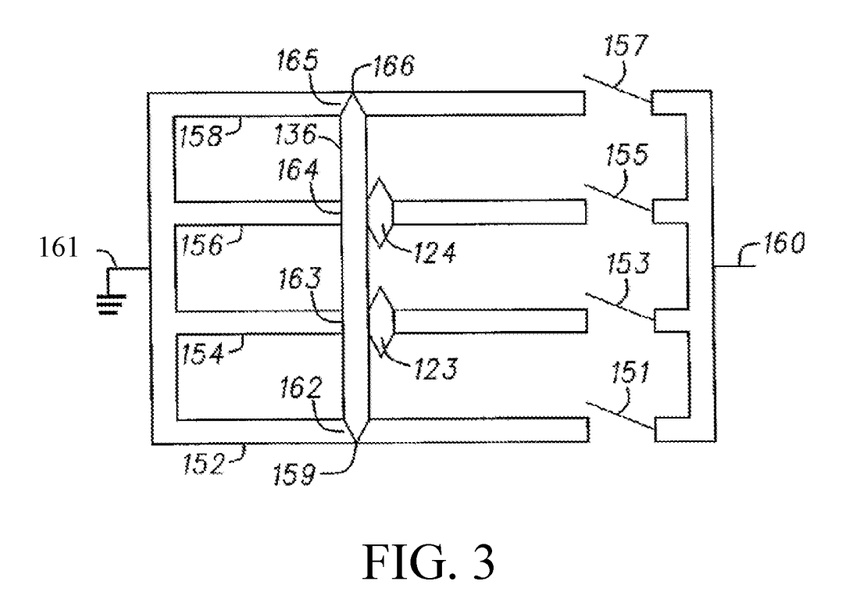
FIG. 3 is a top view of the structure of FIG. 2 with the structure including switches that couple a voltage from a first conductor, through lines of the flux guide reset coil, to ground at a second conductor.

A top view of the structure of FIG. 2 is shown in FIG. 3 and includes switches 151, 153, 155, 157 coupling a voltage from conductor 160 through the reset lines 157, 154, 156, 158 to ground at conductor 161. The plurality of reset lines 152, 154, 156, 158 is positioned below, and orthogonal to, the flux guide 136. In another embodiment, the reset line can be placed above or on both sides of the flux guide and the sense elements. In operation, the switches 151, 153, 155, 157 are "closed" in a sequence to provide a current pulse in the reset lines 152, 154, 156, 158 that creates the magnetic field 130 from one end 159 of the flux guide 136 to the other end 166 of the flux guide 136. An exemplary sequence for the closing of the switches, switch 151 is closed during a time period t1, creating a magnetic field in the portion 162 of the flux guide 136. The magnetic domain walls in the portion 162, if any, may be moved towards the other end 166 of the flux guide 136 by this magnetic field.

Figure 4:
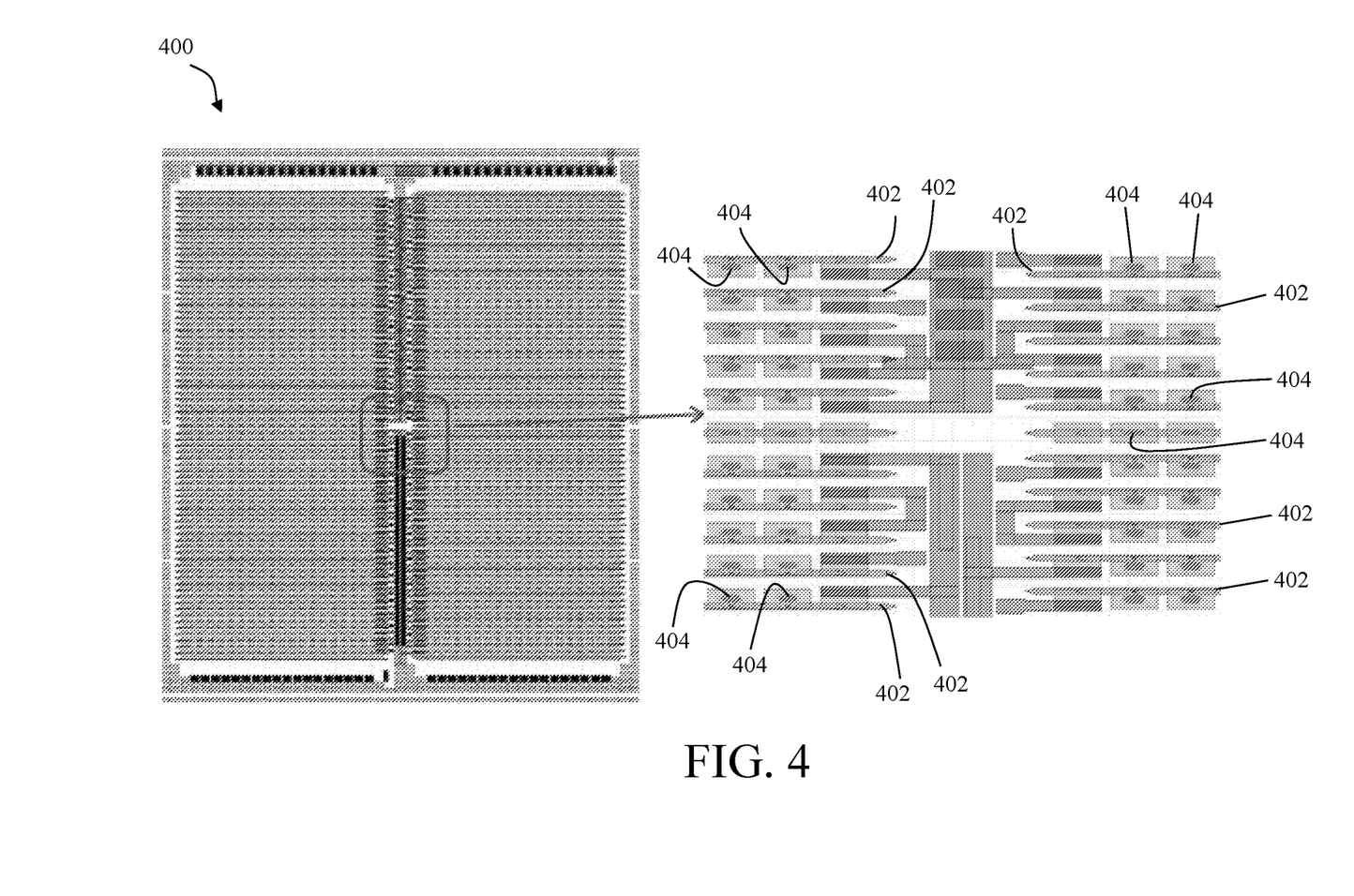
FIG. 4 is an enlarged view of a typical Z-sensor Wheatstone bridge with flux guides arranged asymmetrically around tunneling magnetoresistance (TMR) sense elements.

However, if the current were removed from the reset line 152, the magnetic domain walls may come back and be reestablished in portion 162. In order to prevent this reestablishment of the magnetic domain, switch 151, as well as switch 153, are closed during a time t2. Then switches 153 and 155 are closed during a subsequent time t3. At a time t4, switches 155 and 157 are closed, and finally, during a time t5, switch 157 is closed. This sequence of "sweeping" the magnetic reset field along the flux guide 136 sweeps the magnetic domain walls from one end to the other end of the flux guide, preventing the magnetic domains from being reestablished in the portions 162-165 after the reset field has been removed. At the end of the sequence, the entire flux guide is in a single domain state. Further details of the MR sensor and Z-flux reset are found in the '211 Patent incorporated by reference above. A conventional Z-sensor Wheatstone bridge 400 with a plurality of asymmetrical flux guides 402 arranged around TMR sense elements 404 is shown in FIG. 4.

Advanced TMR sensors also have a sense element reset line or coil, which generates a sense element reset field to eliminate magnetic domains and reduce the Barkhausen noise in the sense element. In existing designs, the sense element reset operation is performed independently from the flux guide reset operation, and the sense element reset operation is performed using a different set of lines and drive circuitry than the flux guide reset operation. The sense element reset lines are thin so as to generate large localized peak fields across a few microns, while the flux guide reset operation requires more uniform fields across the length of a flux guide, which can span hundreds of microns.

Figure 5:
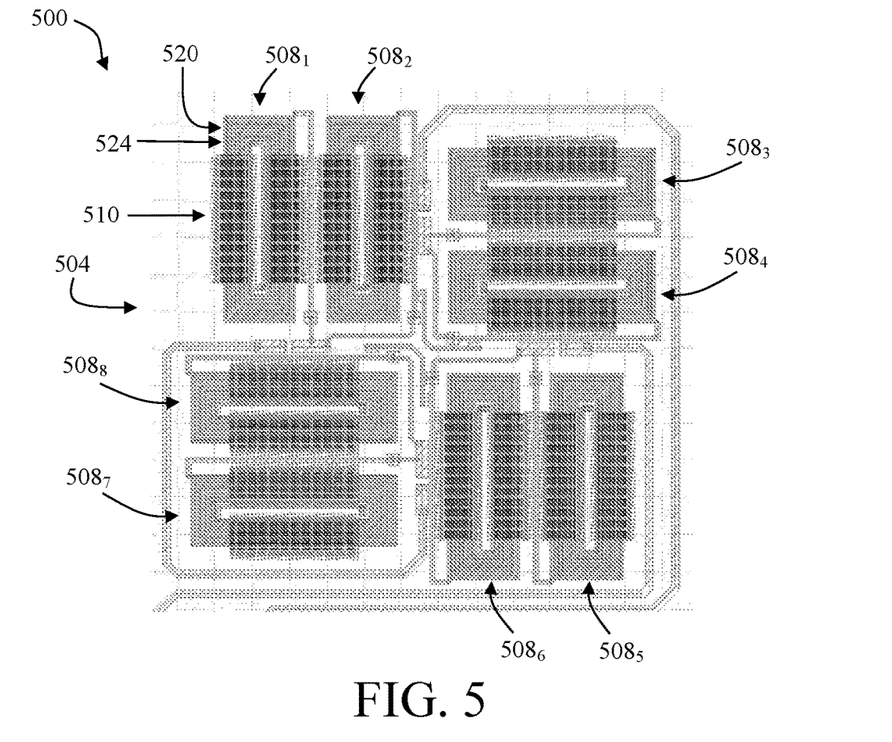
FIG. 5 is a top view of a TMR magnetic field sensor with an arrangement of sub-blocks that form a Z-sensor according to the disclosure, the sub-blocks each including a sense element reset coil and a flux guide reset coil configured to generate respective reset fields for reorienting magnetizations of sense elements and flux guides within the sub-block.

FIG. 5 depicts a portion of a TMR magnetic field sensor device 500 according to the present disclosure. The TMR device 500 includes first, second, and third differential sensors configured to detect the component directions of an applied field along first (y), second (x), and third (z) axes, respectively, similar to how the differential sensors 101, 111, 121 of FIG. 1 detect the component directions of an applied field. The third differential sensor 504, or Z-sensor, of the TMR device 500 is configured to detect the component direction of the applied magnetic field along the third axis or z-axis direction.

Figure 6:
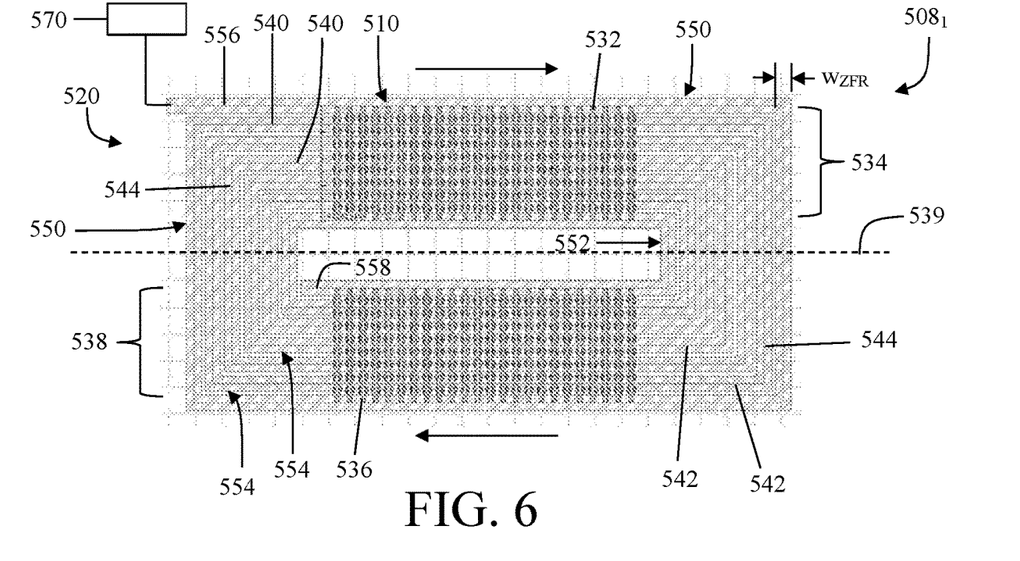
FIG. 6 is an enlarged top view of a sub-block of the TMR magnetic field sensor of FIG. 5 showing the flux guide reset coil arranged relative to the sense elements and the flux guides of the sub-block.
Figure 7:
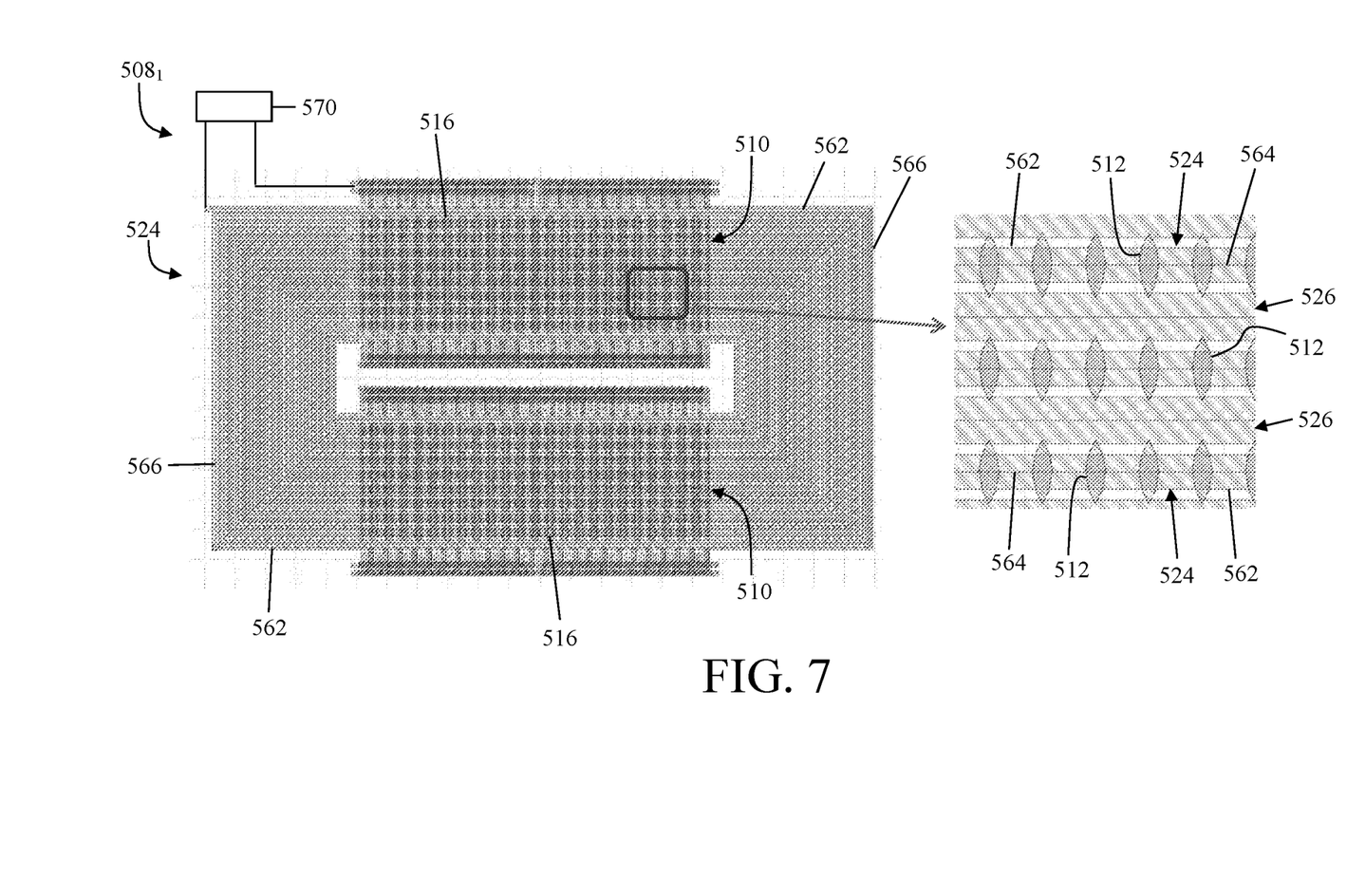
FIG. 7 is an enlarged top view of the sub-block of FIG. 5 showing the sense element reset coil and a flux guide reset assist coil both arranged relative to the sense elements and the flux guides of the sub-block.

The Z-sensor 504 includes eight sub-blocks $508_1$-$508_8$, such as the sub-block $508_1$ shown in detail in FIGS. 6 and 7, with each sub-block $508_x$ including a sensor array 510 with sense elements 512 and flux guides 516, an independent Z-flux guide reset (ZFR) coil 520, and an independent sense element reset (BR) coil 524. The independent ZFR and BR coils 520, 524 of each sub-block $508_x$ enable the sub-blocks to be reset independently from one another between read cycles of the Z-sensor 504. As an illustrative example, the independent ZFR and BR coils 520, 524 of sub-block $508_1$ enable the respective sense elements 512 and flux guides 516 of sub-block $508_1$ to be reset independently from the respective sense elements 512 and flux guides 516 of the other sub-blocks $508_2$-$508_8$ (i.e., the sense elements and the flux guides of sub-blocks $508_2$-$508_8$ are not reset when the sense elements and the flux guides of sub-block $508_1$ are reset). As another illustrative example, the independent ZFR and BR coils 520, 524 enable the respective sense elements and flux guides of sub-blocks $508_1$, $508_3$, $508_5$, and $508_7$ to be reset independently while the respective sense elements and flux guides of sub-blocks $508_2$, $508_4$, $508_6$, and $508_8$ are not reset.

The positional relationship among the sensor array 510, the ZFR coil 520, and the BR coil 524 (which obscures the ZFR coil 520 in FIG. 5) of each sub-block $508_x$ is generally similar from sub-block to sub-block and defines an orientation of the sub-block. As shown in FIG. 5, the eight sub-blocks $508_x$ are laid out in horizontal and vertical orientations relative to one another. For example, sub-blocks $508_1$ and $508_2$ have vertical orientations relative to the viewing direction of the figure while sub-blocks $508_3$ and $508_4$ have horizontal orientations relative to the viewing direction of the figure. The different sub-block orientations mitigate the effects of stress and temperature on the performance of the Z-sensor because these effects in the anisotropy directions are averaged together.

FIG. 6 shows the ZFR coil 520 superimposed over sub-block $508_1$ of the Z-sensor 504 according to one aspect of the present disclosure. The ZFR coil 520 is arranged substantially in a plane within a first metal layer of a substrate of the Z-sensor 504. As used herein, the ZFR coil 520 is "arranged substantially in a plane" means that both active portions of the ZFR coil 520 configured to exert a reset field on the sensor array 510 and inactive portions of the ZFR coil 520 that connect the active portions to one another extend along a single plane within the sub-block. The ZFR coil 520 is positioned below the sensor array 510 in the embodiment shown in FIG. 6. In other embodiments, the ZFR coil 520 can be positioned above the sensor array 510.

The ZFR coil 520 has a plurality of parallel segments 540, 542 routed past the sensor array 510. The parallel segments 540, 542 are oriented orthogonal to the flux guides 516 so as to generate a first reset field along the preferred magnetization direction of the flux guides 516 when the ZFR coil 520 is energized. As used herein, the parallel segments 540, 542 are "routed past" the sensor array 510 means that parallel segments extend along their length proximate to the flux guides 516 of the sensor array 510 such that the first reset field (in combination with the second reset field described in connection with FIG. 7) can reorient the magnetization of the flux guides to the preferred magnetization direction. In some embodiments, the parallel segments 540, 542 pass one of directly above or directly below the flux guides 516 when viewed in a direction perpendicular to the plane in which the ZFR coil 520 is arranged.

Figure 8:
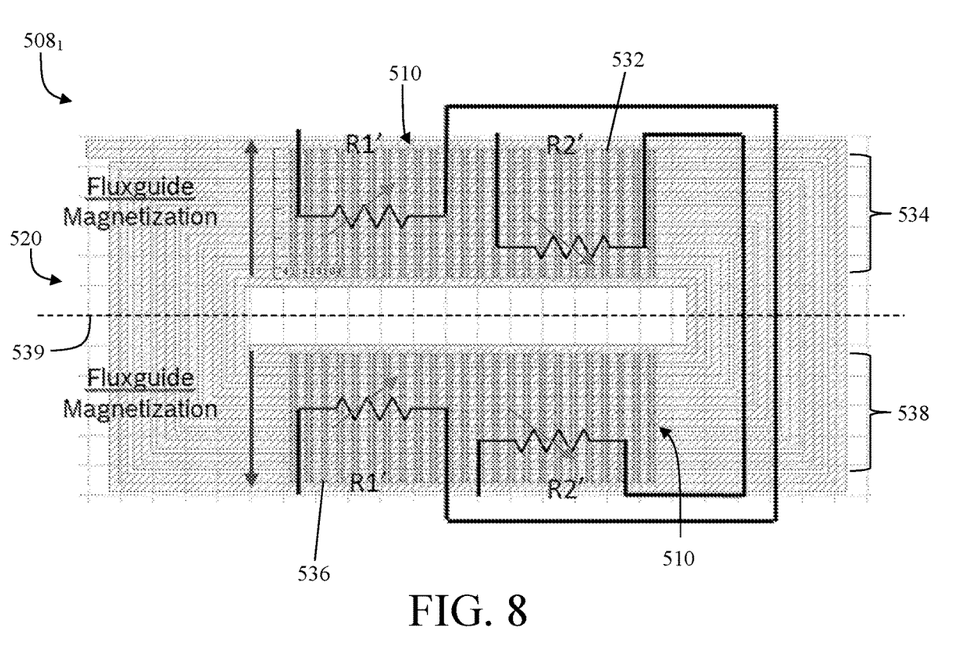
FIG. 8 is an enlarged top view of the sub-block of FIG. 5 illustrating the opposite magnetizations of the flux guides on different halves of the sub-block.

The flux guides 516 of each sensor array 510 further include first flux guides 532 arranged in a first region 534 of the sensor array 510 and second flux guides 536 arranged in a second region 538 of the sensor array 510. In one embodiment, the first and second regions 534, 536 are disposed symmetrically about a plane 539. The first and second flux guides 534, 536 have respective first and second predetermined magnetization directions that are opposite one another as shown in FIG. 8 by the opposite arrows representing the "flux guide magnetization" directions. The sense elements 512 of the sensor array 510 in some embodiments define a 72×8×2 bit array. The parallel segments of the ZFR coil 520 further include a plurality of parallel first segments 540 routed orthogonally past the first flux guides 532 and a plurality of parallel second segments 542 routed orthogonally past the second flux guides 536.

Accordingly, in one feature of the present disclosure, the flux guide magnetization orientations of each sub-block $508_x$ are divided into an upper half and a lower half with opposing orientations after a flux guide reset operation is executed. This configuration allows an internal compensation within the sensing transducer for any process induced asymmetries that result in stray in-plane fields emanating from the flux guides and acting on the sense elements themselves. Such stray fields will act in opposite directions on the top and bottom half of the sensor bridge and their electrical influence on sense element resistance is eliminated via the bridge interconnect wiring which averages resistances of sense elements in top and bottom halves of the sub-block together, as illustrated in FIG. 8.

The ZFR coil 520 also has a plurality of further segments 544 that connect the first and second segments 540, 542 to one another. These further segments 544 are sometimes referred to as the "coil completing routing." The further segments 544 in the embodiment shown are routed past portions of the sub-block 508₁ that are not occupied by the sensor array 510. In some embodiments, the further segments 544 in these portions of the sub-block 508₁ are strapped to other metal layers of the substrate so as to reduce a resistance of the ZFR coil 520. The further segments 544 in other embodiments have a width ($w_{zfr}$) that is wider or different than a width of the parallel segments 540, 542 so as to optimize porosities and performance. In yet further embodiments, the sense elements 512 and the flux guides 516 are also placed in regions proximate to the further segments 544 and contribute to the sensing area of the Z sensor and further lower the overall system noise.

The ZFR coil 520 in the embodiment depicted in FIG. 6 is a planar rectangular coil that has an outermost coil portion 550, an innermost coil portion 552, and a plurality of interior turns 554 disposed between the outermost and innermost coil portions 550, 552. The rectangular coil 520 has a start segment 556 that extends linearly for a long-side length, then a first coil segment that is oriented 90 degrees from the start segment and extends linearly for a short-side length, and then a second coil segment that is oriented 90 degrees from the first coil segment and extends linearly for another long-side length. This pattern continues with the long-side and short-side lengths getting shorter after each successive turn about a winding axis to define the coil.

The rectangular coil 520 has a finish segment 558 that is closer to the winding axis than the start segment 556. The start segment 556 and the three immediately succeeding coil segments define the outermost coil portion 550 of the ZFR coil 520. The finish segment 558 and the three immediately preceding coil segments define the innermost coil portion 552 of the ZFR coil 520. In one embodiment, the width ($w_{zfr}$) of one or more of the outermost coil portion 550 and the innermost coil portion 552 is different than the width of the interior turns. This difference in coil widths allows a type of field focusing and higher uniformity, or magnified, field to be applied over the entire flux guide length, as the other contributions from adjacent coils will not sum to the same field value at the ends of the flux guide because there are no coil turns present beyond the edge of the coil.

The sense element reset (BR) coil 524 is provided in a separate metal layer overlaying the ZFR coil 520 and the sensor array 510, as depicted in FIG. 7. The BR coil 524 is arranged substantially in a plane that is spaced apart from the plane in which the ZFR coil 520 is arranged, and the BR coil 524 is electrically insulated from the ZFR coil 520. The BR coil 524 is positioned relative to the sensor array 510 in such a way that it can perform the sense element reset operation as well as add to the total reset field during the flux guide reset operation with the ZFR coil 520. The BR coil 524 is positioned above the sensor array 510 in the embodiment shown in FIG. 7. In another embodiment, the BR coil 524 can be positioned below the sensor array 510 in which case the ZFR coil 520 would typically be positioned above the sensor array 510.

The BR coil 524 has a plurality of parallel segments 562 routed past the sensor array 510. The parallel segments 562 are oriented orthogonal to the flux guides 516 so as to generate a second reset field along the preferred magnetization direction of the flux guides 516 when the BR coil 524 is energized during the flux guide reset operation. Additionally, a centerline 564 of each of the parallel segments 562 is aligned centrally with a respective row of the sense elements 512 in the sensor array 510 so that the second reset field eliminates magnetic domains and reduces the Barkhausen noise in the sense elements during the sense element reset operation. The BR coil 524 also has further segments 566 that connect the parallel segments 562 to one another. The further segments 566 are routed past portions of the sub-block 508₁ that are not occupied by the sensor array 510. The BR coil 524 in the embodiment depicted in FIG. 7 is a planar rectangular coil. In some embodiments, the planar rectangular BR coil 524 has an outermost coil portion, an innermost coil portion, and a plurality of interior turns that are arranged in a manner similar to the planar rectangular ZFR coil 520 described with reference to FIG. 6.

The Z-sensor 504 in some embodiments also includes a flux guide reset (FGR) assist coil 526. The FGR assist coil 526 is arranged substantially in the plane in which the BR coil 524 is arranged, and the FGR assist coil 526 is interleaved in spaces between adjacent portions of the BR coil 524. The FGR assist coil 526 is configured to create additional field uniformity between the locally strong fields centered on the sense elements. The FGR assist coil 526 also operates to assist during the flux guide reset operation. The FGR assist coil 526 in some embodiments is a planar rectangular coil that has an outermost coil portion, an innermost coil portion, and a plurality of interior turns that are arranged in a manner similar to the planar rectangular BR coil 524.

The Z-sensor 504 further includes drive circuitry 570 operatively connected to each of the ZFR coil 520 and the BR coil 524. The drive circuitry 570 is also operatively connected to the FGR assist coil 526 if the Z-sensor includes this coil. The term "drive circuitry" as used herein refers generally to structures, devices, or the like configured to make and/or break electrical connections and/or deliver voltage and/or current to/from/between one or more conductive elements for which drive circuitry is operatively associated or connected. The drive circuitry 570 of the Z-sensor 504 is specifically configured execute the flux guide reset operation and the sense element reset operation independently from one another within each sub-block 508$_x$ and independently among the different sub-blocks 508$_x$.

To carry out the flux guide reset operation, the drive circuitry 570 is configured to energize both the ZFR coil 520 and the BR coil 524 to generate the first reset field about the ZFR coil 520 and the second reset field about the BR coil 524, respectively. The first and second reset fields combine to establish a total reset field sufficient to reorient the magnetization of the flux guides 516 into a known, previously-calibrated state, which can be interchangeably referred to as the preferred/predetermined magnetization direction/orientation of the flux guide or the preferred/predetermined flux guide magnetization direction/orientation. In another embodiment for carrying out the flux guide reset operation, the drive circuitry is further configured to energize the FGR assist coil 526 to generate a third reset field about the FGR assist coil 526. The third reset field having the effect of smoothing the first reset field near the flux guides, which facilitates reorienting the magnetization of the flux guides during the flux guide reset operation.

To carry out the sense element reset operation, the drive circuitry 570 is configured to energize only the BR coil 524 to generate the second reset field. The second reset field by itself is sufficient to eliminate magnetic domains and reduce the Barkhausen noise in the sense elements without changing the preferred magnetization direction of the flux guide. While the ZFR coil 520 is optimized for low resistance and field uniformity, the BR coil 524 is optimized for high peak field to minimize the current required during the sense element reset operation. The increase in resistance caused by the relatively narrower width of the BR coil 524 and the accompanying increase in drive voltage are accommodated in one embodiment by energizing the BR coil 524 in multiple phases per sub-block.

In one example of multi-phase energization of the BR coil 524, the BR coil 524 is configured to be selectively divided into a plurality of phase portions. In the flux guide reset operation, the phase portions are connected in series and energized simultaneously. In the sense element reset operation, the phase portions are divided and energized separately. The selective division of the BR coil 524 into the plurality of phase portions is accomplished in one embodiment by the drive circuitry 570. The multi-phase energization of the BR coil 524 during the sense element rest operation effectively reduces the drive voltage requirement to a voltage level that is achievable in conventional consumer devices. A further advantage of dividing the BR coil 524 into phases is that the driving current during the flux guide reset operation is accordingly divided, which reduces any perturbation of the TMR cell magnetization by the flux guide reset operation.

To carry out the flux guide reset operation in another embodiment, the FGR assist coil 526 is divided into a plurality of separate portions (energizable segments) and the drive circuitry 570 is configured to energize each of the energizable segments in parallel. This arrangement enables the optimization of the voltage required for the flux guide reset operation with the result of a multiplied current for the FGR assist coil energization. The division of the FGR assist coil 526 into the energizable segments in one embodiment is accomplished by the drive circuitry 570 such that there is minimal impact to the layout of the FGR assist coil 526 on each sub-block $508_x$ of the Z-sensor 500. In another embodiment, the FGR assist coil 526 is configured as a planar rectangular coil that is segmented along its length into two or more energizable segments, and the drive circuitry 570 is configured to energize the two or more energizable segments in parallel. In yet another embodiment, the FGR assist coil 526 can have a different layout that includes the two or more energizable segments that are energized by the drive circuitry 570.

To carry out the flux guide reset operation in yet another embodiment, one or more of the ZFR coil 520 and the BR coil 524 can be selectively divided, when needed and useful, into separate portions (energizable segments) and the drive circuitry 570 is configured to energize each of the energizable segments of each of the ZFR coil 520 and the BR coil 524 in parallel. The division of the ZFR coil 520 and/or the BR coil 524 into the energizable segments in one embodiment is accomplished in a similar manner as described with respect to the FGR assist coil 526.

Figure 9:
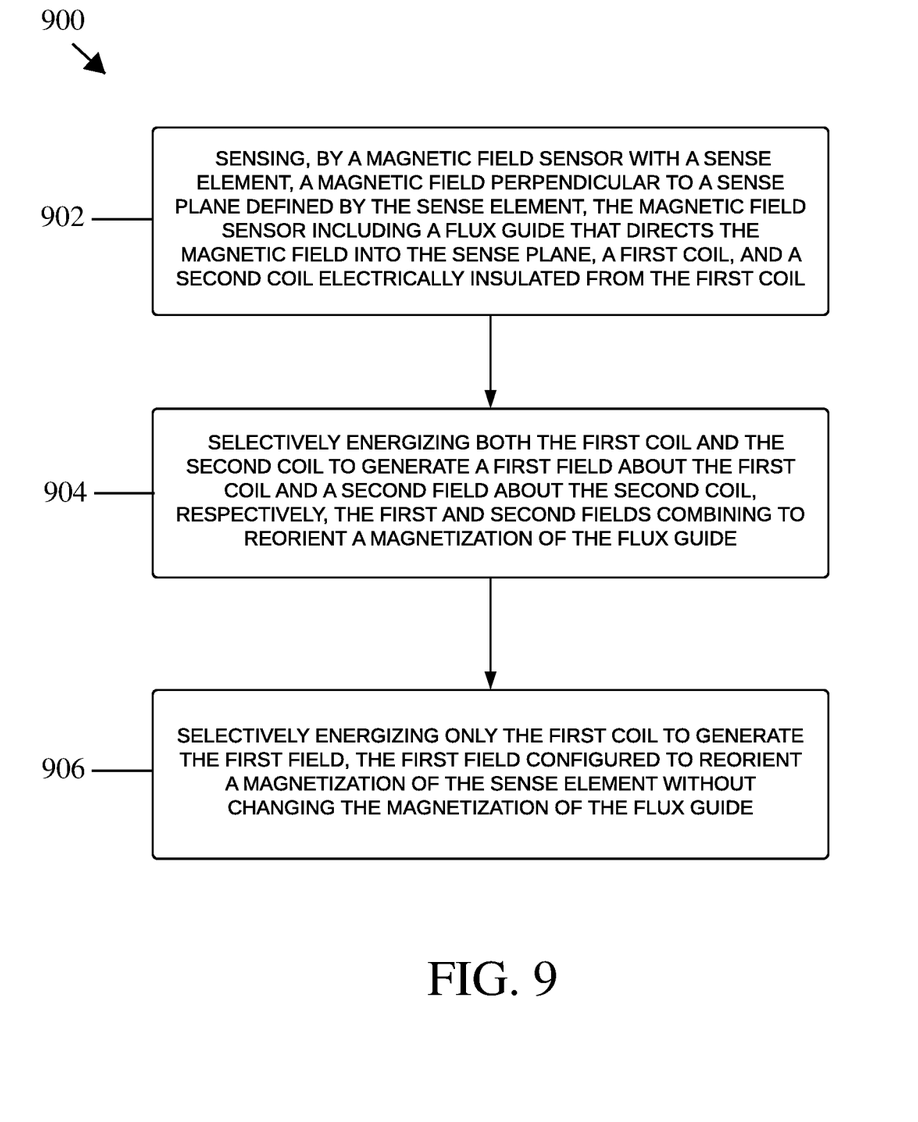
FIG. 9 illustrates a method for operating the TMR magnetic field sensor of FIG. 5.

FIG. 9 is a flow chart that illustrates a method 900 for operating a TMR magnetic field sensor. The method 900 is described with reference to the Z-sensor 504 of FIGS. 5-8. It should be appreciated that method 900 may include any number of additional or alternative tasks, the tasks shown in FIG. 9 need not be performed in the illustrated order, and method 900 may be incorporated into a more comprehensive procedure or process having additional functionality not described in detail herein. Moreover, one or more of the tasks shown in FIG. 9 could be omitted from an embodiment of the method 900 as long as the intended overall functionality remains intact.

Referring to FIG. 9, the method 900 includes sensing 902, by a magnetic field sensor 504 with a sense element 512, a magnetic field perpendicular to a sense plane defined by the sense element, the magnetic field sensor including a flux guide 516 that directs the magnetic field into the sense plane, a first coil 524, and a second coil 520 electrically insulated from the first coil; selectively energizing 904 both the first coil 524 and the second coil 520 to generate a first field about the first coil 524 and a second field about the second coil 524, respectively, the first and second fields combining to reorient a magnetization of the flux guide 516; and selectively energizing 906 only the first coil 524 to generate the first field, the first field configured to reorient a magnetization of the sense element 512 without changing the magnetization of the flux guide 516.

In one embodiment of the method, the sense element reset operation is executed after the flux guide reset operation so that the sense element magnetizations are in their known, design orientation during subsequent measurement cycles. In another embodiment of the method, only individual phases of the BR coil 524 are activated during the sense element reset operation. For the flux guide reset operation, all phases (connected in series) of the BR coil 524 are simultaneously activated. In another embodiment of the method, the BR coil 524 and ZFR coil 520 are fabricated with different metals and/or in different process steps such that their respective process variations might be divergent. For example, due to process variations, the ZFR coil 520 may have a resistivity that is higher than nominal while the BR coil 524 may be produced with a resistivity lower than nominal.

In operation, a reset current $I_{RST}$ is generated by applying a constant voltage $V_{COIL}$ to each coil, so that: $I_{RST} = V_{COIL}/R$, where R is the coil resistance. In the disclosed embodiment, if the voltage to be applied to the coils is calibrated only according to the resistance of the ZFR coil 520, the BR coil 524 will be energized with a higher than nominal current, thus causing an increased power dissipation and/or a perturbation to the flux guide magnetization. To avert this condition, one embodiment of the method includes performing two calibrations, which yield two different voltages: $V_{COIL\_BR}$ and $V_{COIL\_ZFR}$. Therefore, for each reset operation, a calibrated coil voltage is used to generate the required target current with minimal margin, which further optimizes the device power consumption. In another embodiment of the method, the calibrated voltages are trimmed with reference to temperature so as to allow the optimal reset current and field to be applied even in the presence of a temperature dependent metal line resistance of either of the reset coils.

The present disclosure contemplates a Z-sensor 504 that implements at least two planar coils, the ZFR coil 520 and the BR coil 524, to execute the sense element reset operation and the flux guide reset operation. In another embodiment, three planar coils, the ZFR coil 520, the BR coil 524, and the FGR assist coil 526, are used to execute the sense element reset operation and the flux guide reset operation. In one manner of operation, the three coils are activated according to the schedule shown in Table 1.

TABLE 1

| Reset Operation | Z-Flux Guide Reset Coil | Sense Element Reset Coil | Flux Guide Assist Coil |
|---|---|---|---|
| Z-Sense Element Reset | | X | |
| Z-Flux Guide Reset | X | X | X |

The present disclosure contemplates a Z-sensor in the form of an out-of-plane (Z-axis) tunneling magnetoresistive (TMR) magnetic field sensor that provides a stable output that is resistant to exposure to external field shocks and that minimizes the power needed to operate the sensor. The TMR Z-sensor includes at least a Z-flux guide reset coil and sense element reset coil that are activated together to perform a Z-flux guide reset. The benefit of this bridge is a more accurate read-out of the out-of-plane (Z) magnetic field while reducing the power needed to operate the sensor. This configuration is an advantage over the existing technology of magnetic sensors as it allows highly stable zero field output and minimizes the temperature dependence of this zero field output. Additionally, longer battery life is sustained in mobile applications that utilize the invention.

According to the present disclosure, a system and method is provided to reduce the voltage and power budget of Z-flux guide reset by: (1) using the sense element reset coil simultaneously with the Z-flux guide reset coil to generate a sufficient flux guide reset field while reducing the voltage overhead of the system; (2) splitting the Z-sensor into multiple sub-blocks, and performing the Z-flux guide reset operation for each sub-block separately, reducing the charge per reset operation and substantially reducing the required size of any charge reservoir; (3) activating the sense element reset coil in subsequent phases during the sense element reset operation, while using the full coil during the Z-flux guide reset operation, which accommodates the competing requirements of achieving a high peak field with relatively high current in the sense element reset operation, while contributing to a lower more uniform field, possibly with a lower current, in the flux guide reset operation; and (4) utilizing a custom metal layer with ultra-low resistance and close proximity to the flux guide to maximize coupling field from a given voltage source (field factor).

While the disclosure has been illustrated and described in detail in the drawings and foregoing description, the same should be considered as illustrative and not restrictive in character. It is understood that only the preferred embodiments have been presented and that all changes, modifications and further applications that come within the spirit of the disclosure are desired to be protected.

What is claimed is:

1. A magnetic field sensor, comprising:
a sense element arranged on a substrate of the sensor and defining a sense plane;
a flux guide arranged on the substrate and configured to direct a magnetic field perpendicular to the sense plane into the sense plane;
a first coil arranged substantially in a first plane;
a second coil arranged substantially in a second plane that is spaced apart from the first plane, the second coil electrically insulated from the first coil; and
drive circuitry operatively connected to each of the first coil and the second coil, the drive circuitry configured:
(i) in a first reset mode to energize both the first coil and the second coil to generate a first field about the first coil and a second field about the second coil, respectively, that combine to set a predetermined magnetization direction of the flux guide, and
(ii) in a second reset mode to energize only the first coil to generate the first field so as to set a predetermined magnetization direction of the sense element without changing the predetermined magnetization direction of the flux guide.

2. The magnetic field sensor of claim 1, wherein the first coil is configured to be selectively divided into a plurality of phase portions that (i) in the first reset mode are connected in series and energized simultaneously and (ii) in the second reset mode are divided and energized separately.

3. The magnetic field sensor of claim 1, wherein the first coil is disposed in a first metal layer of the substrate positioned one of above or below the sense element and the flux guide, and wherein the second coil is disposed in a second metal layer of the substrate positioned the other one of above or below the sense element and the flux guide.

4. The magnetic field sensor of claim 1, wherein the sense element and the flux guide are each plural in number, the sense elements and the flux guides defining a sensor array arranged within a sub-block of the substrate.

5. The magnetic field sensor of claim 4, wherein the predetermined magnetization directions of at least two of the flux guides are opposite after the first reset mode.

6. The magnetic field sensor of claim 4, wherein the second coil has (i) a plurality of parallel segments routed past the sensor array and oriented orthogonal to the flux guides and (ii) a plurality of further segments connected to the parallel segments and routed past portions of the sub-block not occupied by the sensor array.

7. The magnetic field sensor of claim 6, wherein the further segments one or more of (i) are strapped to other metal layers of the substrate so as to reduce a resistance of the second coil and (ii) have a width that is different than a width of the parallel segments so as to optimize parasitics and performance of the second coil.

8. The magnetic field sensor of claim 6, wherein the first coil has a plurality of parallel segments routed past the sensor array and oriented orthogonal to the flux guides, each of the parallel segments of the first coil having a centerline aligned centrally with a respective row of the sense elements.

9. The magnetic field sensor of claim 4, wherein the flux guides include first flux guides arranged in a first region of the sensor array and second flux guides arranged in a second region of the sensor array, the first and second flux guides having respective first and second predetermined magnetization directions that are opposite one another.

10. The magnetic field sensor of claim 9, wherein the second coil has a plurality of parallel first segments routed orthogonally past the first flux guides and a plurality of parallel second segments routed orthogonally past the second flux guides.

11. The magnetic field sensor of claim 9, wherein the second coil is a rectangular coil with an outermost coil portion, an innermost coil portion, and a plurality of interior turns disposed between the outermost and innermost coil portions.

12. The magnetic field sensor of claim 11, wherein one or more of the outermost coil portion and the innermost coil portion has a width that is different than a width of the interior turns.

13. The magnetic field sensor of claim 1, further comprising a third coil arranged substantially in the first plane and interleaved in spaces between adjacent portions of the first coil, the drive circuitry configured in the first reset mode to energize the third coil to generate a third field about the third coil, the third field configured to smooth the first field near the flux guide.

14. The magnetic field sensor of claim 13, wherein the third coil is divided into a plurality of separate energizable segments, and wherein the drive circuitry is configured in the first reset mode to energize the separate energizable segments in parallel.

15. The magnetic field sensor of claim 1, wherein:

the sense element, the flux guide, the first coil, and the second coil are each plural in number, the sense elements and the flux guides define a plurality of sensor arrays arranged in a corresponding plurality of sub-blocks of the substrate, the sub-blocks each including a respective one of the first coils and a respective one of the second coils, and the drive circuitry is configured to energize the first and second coils of each sub-block independently from the first and second coils of other sub-blocks.

16. The magnetic field sensor of claim 15, wherein the sense elements, the flux guides, the first coil, and the second coil of each sub-block define an orientation of the sub-block, and wherein the orientations of at least two of the sub-blocks are orthogonal to one another.

17. A method of operating a magnetic field sensor, comprising:

sensing, by a magnetic field sensor including a sense element, a magnetic field perpendicular to a sense plane defined by the sense element, the magnetic field sensor further including a flux guide configured to direct the magnetic field into the sense plane, a first coil arranged substantially in a first plane, and a second coil electrically insulated from the first coil and arranged substantially in a second plane that is spaced apart from the first plane;

executing a first reset operation by selectively energizing both the first coil and the second coil to generate a first field about the first coil and a second field about the second coil, respectively, that combine to set a predetermined magnetization direction of the flux guide; and executing a second reset operation by selectively energizing only the first coil to generate the first field so as to set a predetermined magnetization direction of the sense element without changing the predetermined magnetization direction of the flux guide.

18. The method of claim 17, wherein the second reset operation is executed at least once after the first reset operation is executed and prior to a measurement of the magnetic field sensor to ensure the predetermined magnetization direction of the sense element is set.

19. The method of claim 17, wherein the first coil is configured to be selectively divided into a plurality of phase portions, and wherein:

executing the first reset operation includes connecting the phase portions in series and simultaneously energizing the phase portions, and executing the second reset operation includes dividing the phase portions and energizing the divided phase portions separately.

20. The method of claim 17, further comprising:

performing a first calibration to determine a first calibrated voltage to be used to energize the first coil, the first calibration taking into account a first resistance of the first coil; and performing a second calibration to determine a second calibrated voltage to be used to energize the second coil, the second calibration taking into account a second resistance of the second coil.

* * * * *